US011509113B2

(12) United States Patent
Halbritter et al.

(10) Patent No.: US 11,509,113 B2
(45) Date of Patent: Nov. 22, 2022

(54) METHOD FOR PRODUCING A PLURALITY OF TRANSFERABLE COMPONENTS AND COMPOSITE COMPONENT OF COMPONENTS

(71) Applicant: OSRAM OLED GmbH, Regensburg (DE)

(72) Inventors: Hubert Halbritter, Dietfurt (DE); Martin Rudolf Behringer, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 146 days.

(21) Appl. No.: 16/977,165

(22) PCT Filed: Feb. 5, 2019

(86) PCT No.: PCT/EP2019/052775
§ 371 (c)(1),
(2) Date: Sep. 1, 2020

(87) PCT Pub. No.: WO2019/166194
PCT Pub. Date: Sep. 6, 2019

(65) Prior Publication Data
US 2021/0050705 A1    Feb. 18, 2021

(30) Foreign Application Priority Data
Mar. 2, 2018 (DE) .......................... 102018104785.1

(51) Int. Cl.
*H01S 5/183* (2006.01)
*H01S 5/02* (2006.01)

(52) U.S. Cl.
CPC .......... *H01S 5/0215* (2013.01); *H01S 5/0201* (2013.01); *H01S 5/0217* (2013.01); *H01S 5/18327* (2013.01); *H01S 5/18377* (2013.01)

(58) Field of Classification Search
CPC ..... H01S 5/0201; H01S 5/0215; H01S 5/0217
See application file for complete search history.

(56) References Cited

U.S. PATENT DOCUMENTS 8,338,202 B2 * 12/2012 Chinone ............. H01L 21/2007
438/33
2003/0189212 A1   10/2003 Yoo
(Continued)

FOREIGN PATENT DOCUMENTS

DE          10042947 A1    3/2002
DE      102004030603 A1    2/2005
(Continued)

OTHER PUBLICATIONS

Kang et al., "Compliant, Heterogeneously Integrated GaAs Micro-VCSELs towards Wearable and Implantable Integrated Optoelectronics Platforms", Advance Optical Materials, 2014, vol. 2, 10 pages.

*Primary Examiner* — Michael Carter
(74) *Attorney, Agent, or Firm* — MH2 Technology Law Group LLP

(57) ABSTRACT

A method for producing a composite component (100) and a composite component (100) comprising a plurality of components (10), a removable sacrificial layer (4), an anchoring structure (3) and a common intermediate carrier (90) are specified. The components each have a semiconductor body (2) comprising an active zone (23), are configured to generate coherent electromagnetic radiation and are arranged on the common intermediate carrier. The sacrificial layer is arranged in a vertical direction between the intermediate carrier and the components. The anchoring structure comprises a plurality of anchoring elements (3A, 3B), wherein the anchoring structure and the sacrificial layer provide a mechanical connection between the intermediate carrier and the components. Without the sacrificial layer, the (Continued)

Figure 1A:
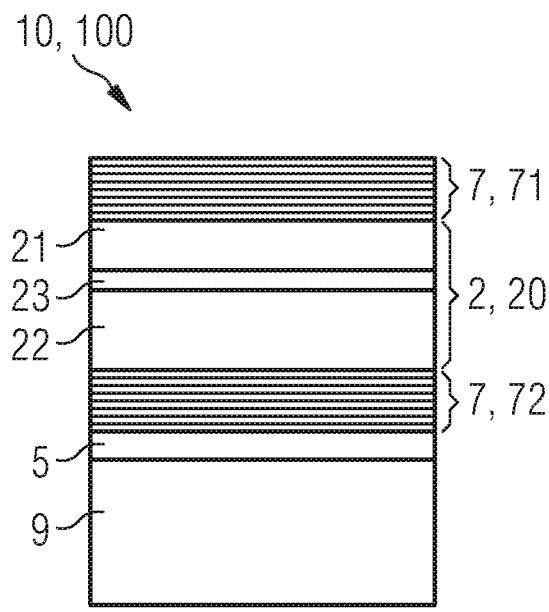

components are mechanically connected to the intermediate carrier solely via the anchoring elements, wherein the anchoring elements are formed in such a way that under mechanical load they release the components so that the components are detachable from the intermediate carrier and are thus formed to be transferable.

17 Claims, 13 Drawing Sheets

(56) References Cited

U.S. PATENT DOCUMENTS

| | | | |
|---|---|---|---|
| 2013/0285086 A1 | 10/2013 | Hu et al. | |
| 2016/0352074 A1* | 12/2016 | Hogan | H01S 5/18388 |
| 2018/0301875 A1* | 10/2018 | Burroughs | H01S 5/183 |

FOREIGN PATENT DOCUMENTS

| | | |
|---|---|---|
| DE | 102010011010 A1 | 10/2010 |
| DE | 102011015725 A1 | 10/2012 |
| DE | 102015116983 A1 | 4/2017 |

* cited by examiner

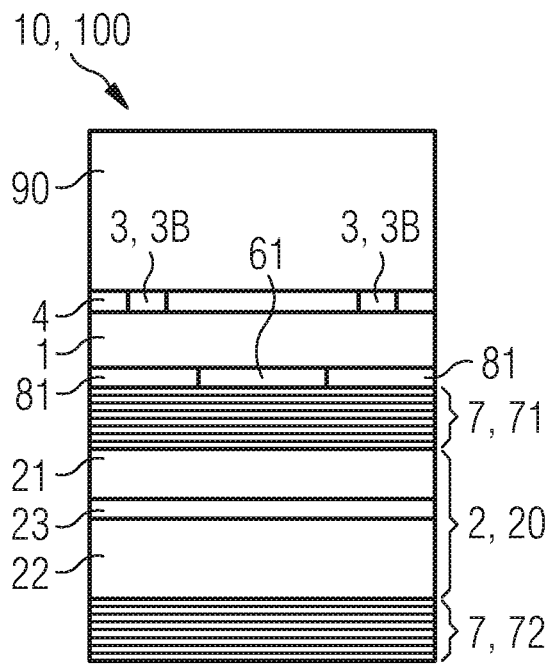
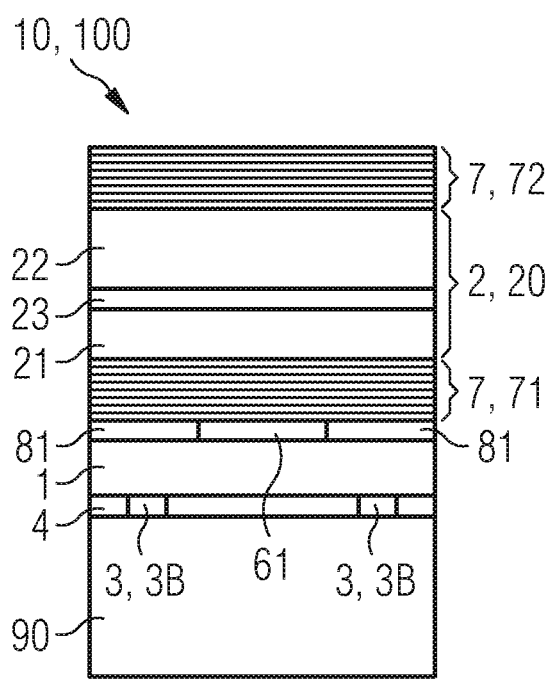

METHOD FOR PRODUCING A PLURALITY OF TRANSFERABLE COMPONENTS AND COMPOSITE COMPONENT OF COMPONENTS

CROSS-REFERENCE TO RELATED APPLICATIONS

This patent application is a national stage entry from International Application No. PCT/EP2019/052775, filed on Feb. 5, 2019, published as International Publication No. WO 2019/166194 A1 on Sep. 6, 2019, and claims priority under 35 U.S.C. § 119 from German patent application 10 2018 104 785.1, filed Mar. 2, 2018, the entire contents of all of which are incorporated herein by reference.

A method for producing a plurality of transferable and in particular printable components is specified. Furthermore, a composite component comprising a plurality of components is specified, wherein the components are formed to be transferable and thus preferably printable.

Conventional surface-emitting laser diodes or VCSELs (vertical-cavity surface-emitting lasers) usually have a growth substrate on which semiconductor layers are grown. The overall height of such a laser diode is mainly determined by the height of the growth substrate. The total thermal resistance of the laser diode depends mainly on the thermal resistance of the growth substrate. It has been found that such components can only be mounted, especially in arrays, on flexible substrates with great effort. The montage of a large number of components is also time-consuming and cost-intensive.

One object is to specify components that can be mounted quickly and in a simplified manner on a given target area. Furthermore, a reliable and cost-efficient method for producing a large number of such components is specified.

These objects are solved by the method and the composite component according to the independent claims and/or in connection with such a method or with such a composite component comprising a plurality of components. Further designs and further developments of the method or the composite component or component are the subject matter of the further claims.

According to at least one embodiment of the method, a semiconductor structure is provided on an intermediate carrier. In particular, the intermediate carrier is different from a growth substrate on which the semiconductor structure had been grown epitaxially, for instance. The semiconductor structure can be separated into a plurality of semiconductor bodies, wherein the semiconductor bodies in particular form main bodies of the components of the composite component which is to be produced. In particular, the semiconductor structure has an active zone which is provided for generating electromagnetic radiation during operation of the component or of the composite component to be produced. For example, the component, in particular the active zone, is configured to generate coherent electromagnetic radiation, for example in the ultraviolet, visible or infrared spectral range.

In particular, the method aims at the production of a plurality of transferable components on the common intermediate carrier, wherein the components is formed in particular to be detachable from the intermediate carrier and can be printed, for example by using a stamp or several stamps, successively or in groups on a target surface, in particular on a printed circuit board. The target surface or the printed circuit board can be a surface or a contact level of a carrier of an electronic device. The carrier of the electronic device may include transistors, such as thin-film transistors, and/or electrical circuits, such as those used to drive the component or components.

According to at least one embodiment of the method, a sacrificial layer is disposed vertically between the semiconductor structure and the intermediate carrier. For example, the sacrificial layer is formed from a material such as germanium or silicon. The sacrificial layer can be formed on the intermediate carrier before the semiconductor structure is mounted on the intermediate carrier. With respect to the intermediate carrier and the semiconductor structure, the sacrificial layer may be formed of a selectively removable material. For example, the material of the sacrificial layer is chosen in such a way that it can be dissolved by an etching process without damaging the intermediate carrier and/or the semiconductor structure. It is also possible that the sacrificial layer is first formed on the semiconductor structure before the semiconductor structure having the sacrificial layer is attached to the intermediate carrier.

A lateral direction is understood to mean a direction which is in particular parallel to a main extension surface of the intermediate carrier and/or of the component. For example, the lateral direction is parallel to the sacrificial layer. A vertical direction is understood to mean a direction which is in particular perpendicular to the main extension surface of the intermediate carrier and/or of the component. The vertical direction and the lateral direction are for instance orthogonal to each other.

According to at least one embodiment of the method, an anchoring structure comprising a plurality of anchoring elements is formed. In particular, the anchoring structure is formed in such a way that the components are mechanically connected to the intermediate carrier solely via the anchoring structure, especially after removal of the sacrificial layer. In other words, after removing the sacrificial layer, the components can be mechanically connected to the intermediate carrier exclusively via the anchoring elements of the anchoring structure.

The anchoring elements are preferably formed in such a way that they release the components, especially under mechanical load, so that the components are detachable from the intermediate carrier and are thus transferable. The mechanical load can be a tensile or compressive force exerted on the anchoring structure and/or on the anchoring elements. For example, the anchoring elements are formed with regard to their geometries and/or their materials in such a way that they are formed to be breakable or detachable under mechanical load. For example, the anchoring elements are formed in such a way that they break or tear off when the associated component is removed. Especially in this sense, the anchoring element is formed to be mechanically breakable. A mechanical breakage can be achieved for instance within one layer of the same material. If the anchoring element is formed to be detachable, the detachment of the anchoring element from the component or from the intermediate carrier takes place for instance at an interface between the anchoring element and the component or the intermediate carrier, usually at an interface between two layers in particular of different materials.

According to at least one embodiment of the method, the anchoring structure is contained in the sacrificial layer at least in places. The anchoring structure may comprise anchoring columns which are completely enclosed in lateral directions, for example, by the sacrificial layer. In particular, the anchoring columns are arranged below the components. In a plan view of the intermediate carrier, the components may cover, preferably completely cover, the anchoring columns assigned to them. In the vertical direction, the anchoring columns are arranged in particular between the semiconductor structure and the intermediate carrier.

In addition or alternatively, the anchoring structure can contain tethers which are arranged in particular laterally, i.e. sidewards to the components. The anchoring elements may be made of an electrically insulating material. The anchoring elements are preferably formed to be breakable when the associated component is pressed towards the intermediate carrier. The tethers can be arranged on different side surfaces of a component or of the semiconductor body of a component. The tethers can be spaced apart from the side faces of the component or of the semiconductor body.

In at least one embodiment of a method for producing a composite component, a semiconductor structure is provided on a common intermediate carrier. The composite component to be produced has a plurality of transferable components on the intermediate carrier, wherein the components are configured in particular to generate coherent electromagnetic radiation and each have a semiconductor body comprising an active zone. The semiconductor structure is separable in a plurality of semiconductor bodies of the components. In particular, a sacrificial layer is arranged in the vertical direction between the semiconductor structure and the intermediate carrier. An anchoring structure having a plurality of anchoring elements is formed. The sacrificial layer is removed, as a result of which the components are mechanically connected to the intermediate carrier solely via the anchoring structure, wherein under mechanical load the anchoring elements release the components so that the components are formed to be detachable from the intermediate carrier and thus transferable.

The anchoring structure holds the components in an orderly and sufficiently stable manner on the intermediate carrier before they can be removed from the intermediate carrier individually or in groups for further processing steps in a targeted and safe manner. The components can thus be printed individually or in groups. In other words, the components can be removed from the intermediate carrier individually or in groups, in particular by breaking and/or by detaching the anchoring elements, and for example with the aid of a stamp or several stamps, are transferred to a target mounting surface and mechanically and/or electrically fixed to it in particular in the same production process.

According to at least one embodiment of the method, the semiconductor structure is arranged on a growth substrate. In particular, the semiconductor structure has a plurality of semiconductor layers which are grown on the growth substrate for instance epitaxially. The semiconductor structure is located in the vertical direction for instance between the growth substrate and the intermediate carrier. Preferably, the growth substrate is partially or completely removed from the semiconductor structure before the semiconductor structure is singulated into a plurality of semiconductor bodies of the components. For example, the growth substrate is removed after the semiconductor structure has been attached to the intermediate carrier. It is possible that the substrate is completely removed from the semiconductor structure. The components having the semiconductor bodies emerging from the semiconductor structure can be formed as substrate-less components, especially as substrate-less surface-emitting laser diodes. In other words, the component or composite component can be free of a growth substrate.

In comparison to a component having a growth substrate, the component without the growth substrate may have a lower component height. The overall thermal resistance of the component can be reduced. The montage of the components, for example on flexible printed circuit boards, can be simplified without the growth substrate. Without the growth substrate, whose volume makes up a large part of the total volume of the component, the component can also be easily removed from the intermediate carrier and transferred to a target mounting surface. A low-cost mass transfer of components, for example for the formation of pixels of an illuminated surface, can be achieved. The montage of components with any pitch can also be simplified.

In at least one embodiment of a composite component, the composite has a plurality of components, a removable sacrificial layer, an anchoring structure and an intermediate carrier. The components are arranged in particular on the common intermediate carrier. The components can each comprise a semiconductor body having an active zone, wherein the components are configured in particular to generate coherent electromagnetic radiation. Expediently, the sacrificial layer is arranged in the vertical direction between the intermediate carrier and the components. The anchoring structure may have a plurality of anchoring elements. The anchoring structure and the sacrificial layer can provide a mechanical connection between the intermediate carrier and the components. In particular, the composite component is formed in such a way that without the sacrificial layer, the components are mechanically connected to the intermediate carrier solely via the anchoring elements, wherein under mechanical load, the anchoring elements are formed in such a way that they release the components so that the components are detachable from the intermediate carrier and are thus formed to be transferable.

Such a composite component contains a plurality of detachable and thus transferable and in particular printable components, wherein the sacrificial layer can be removed from the composite component if required. In the presence of the sacrificial layer, however, the components continue to be held in a mechanically stable manner on the intermediate carrier, so that the transport of such a composite component can be carried out without a high risk of breakage.

According to at least one embodiment of the method or the composite component, the anchoring elements comprise tethers which are located sidewards to the components and are formed to be breakable or detachable when the components are removed under mechanical load. In particular, the tethers are formed in such a way in particular with regard to their geometries and/or materials that they break under the effect of pressure. For example, the anchoring elements are made of an electrically insulating material, such as a plastic material. For example, the anchoring elements are made of silicon nitride, silicon oxide or of benzocyclobutene (BCB). The anchoring elements are preferably formed in such a way that they are formed to be breakable, i.e. mechanically breakable, when the associated component is pressed.

According to at least one embodiment of the method or the composite component, the anchoring elements comprise anchoring columns which are located below the components. In the vertical direction, the anchoring columns are arranged in particular exclusively between the intermediate carrier and the components. The anchoring column may be made of a material which is more resistant to etching than the material of the sacrificial layer. For example, the anchoring columns are made of an electrically insulating material such as silica, plastic or other synthetic material.

It is also possible for the anchoring columns to be formed of an electrically conductive material, in particular of a metal such as copper, aluminum, nickel, chromium, platinum or alloys thereof. The components of the composite component may each have a contact layer or a mirror layer, in particular an electrically conductive mirror layer, which is arranged for instance on a rear side of the associated component. The anchoring columns may be electrically conductively connected to the rear contact layers and/or rear mirror layers of the components. The anchoring columns can be used to make electrical contact with the components on the intermediate carrier before they are removed from the intermediate carrier. This makes it possible to test the components individually already in the composite component, for example, with regard to their functionality. It is also conceivable that the lateral tethers are made of an electrically conductive material, such as metal. In this case, the tethers are preferably electrically insulated from the side surfaces of the component or components.

According to at least one embodiment of the method or composite component, the sacrificial layer forms a common boundary layer between the intermediate carrier and the components. Without the sacrificial layer, for example after removal of the sacrificial layer, an interspace, for example a cavity, is formed in particular between the intermediate carrier and the components. The anchoring elements, in particular the anchoring columns and/or the tethers, may be located in places directly adjacent to the cavity or within the cavity. In particular, the anchoring elements are surrounded by the cavity so that the anchoring elements can be broken mechanically more easily if force or pressure is applied.

According to at least one embodiment of the method or the composite component, the components each have a laser resonator. The laser resonator can have a Bragg mirror pair comprising a first Bragg mirror and a second Bragg mirror. The semiconductor body of the respective component is arranged in the vertical direction for instance between the first Bragg mirror and the second Bragg mirror. In particular, at least one of the Bragg mirrors, for example the first Bragg mirror, is formed to be electrically conductive. The Bragg mirror can be formed from several thin semiconductor layers of different refractive indices arranged alternately. It is possible that the laser resonator has at least one Bragg mirror that is electrically insulating. The electrically insulating Bragg mirror may comprise a plurality of alternately arranged and electrically insulating layers of different refractive indices.

In accordance with at least one embodiment of the method or the composite component, both the first Bragg mirror and the second Bragg mirror of the Bragg mirror pair can be formed to be electrically conductive. The semiconductor layers of the Bragg mirror can be formed on the growth substrate or on the semiconductor structure by an epitaxial process. The semiconductor layers of the electrically conductive Bragg mirror can be doped, n-type or p-type.

According to at least one embodiment of the method or the composite component, the second Bragg mirror is electrically conductive. For forming an aperture of the component, in particular for conducting current, the second Bragg mirror can have inner insulating regions. In particular, the insulating regions are oxidized regions of the second Bragg mirror. In the vertical direction, the insulating regions can be arranged centrally in the second Bragg mirror. In the region of the aperture, the insulating regions of the second Bragg mirror are interrupted, for example. In other words, there are no inner insulating regions of the second Bragg mirror in the region of the aperture of the component. The insulating regions of the second Bragg mirror prevent or reduce the current injection for instance in the regions around the aperture. Electrical charge carriers are thus preferentially and increasingly injected into those regions of the semiconductor body which overlap with the aperture of the associated component in top view.

According to at least one embodiment of the method or the composite component, the second Bragg mirror is electrically insulating. In particular, a contact layer is located in the vertical direction between the second Bragg mirror and the semiconductor body of the component, wherein the contact layer are configured for electrically contacting the semiconductor body. In a plan view of the semiconductor body, the second electrically insulating Bragg mirror can completely cover the aperture.

In accordance with at least one embodiment of the method or the composite component, the first Bragg mirror and the second Bragg mirror of the same Bragg mirror pair have different cross-sections in top view. In particular, the second Bragg mirror is formed in such a way that, in a plan view of the semiconductor body, it just completely covers the aperture of the component. The first Bragg mirror can completely cover the semiconductor body of the component. A ratio of the cross-sections of the Bragg mirrors can be between 1 and 20 inclusive, for example between 2 and 10 inclusive or between 3 and 6 inclusive.

According to at least one embodiment of the method or composite component, the components each have an electrically conductive mirror layer on the rear side. In particular, the mirror layer is electrically connected to the first Bragg mirror via a first contact layer. The first contact layer can be directly adjacent to the first Bragg mirror. In particular, the first contact layer only partially covers the first Bragg mirror in order to achieve a local current injection into the semiconductor body.

The first contact layer can be completely surrounded by a first insulating layer in the lateral directions. In particular, the contact layer only covers the semiconductor body in places. The semiconductor body may completely cover the first contact layer and/or the first insulating layer. The first insulating layer is located in the vertical direction, in particular between the first Bragg mirror and the mirror layer. In top view, the first insulating layer may overlap with both the first Bragg mirror and the mirror layer. The first insulating layer may be directly adjacent to the first Bragg mirror and/or directly adjacent to the mirror layer.

With such a design of the first contact layer, the first insulating layer and of the mirror layer, electrical charge carriers can be selectively injected in regions of the semiconductor body which, in top view, have overlaps with the aperture of the component and are configured to generate a main part of the emitting radiation during operation of the component.

In accordance with at least one embodiment of the method or the composite component, the mirror layer is formed with respect to its vertical layer thickness and/or materials in such a way that it serves as a mechanically stabilizing layer and thus as a carrier of the associated component. For example, the mirror layer has a vertical layer thickness of at least 10 µm. For example, the vertical layer thickness of the mirror layer is between 10 µm and 200 µm inclusive, between 30 µm and 200 µm inclusive, between 50 µm and 200 µm inclusive, or between 30 µm and 150 µm inclusive, between 10 µm and 100 µm inclusive, or between 50 µm and 100 µm inclusive. In particular, the mirror layer is the only carrier of the component. If the component is removed from the intermediate carrier, the component has the mirror layer in particular as the only carrier. In other words, the component is free of other carriers, such as of a growth substrate. However, it is also possible that the component has another carrier that is different from the growth substrate and mechanically stabilizes the component. In particular, the mirror layer is arranged in the vertical direction between the further carrier and the semiconductor body. In this case, the mirror layer can have a vertical layer thickness between 10 nm and 1 µm inclusive, for instance between 10 nm and 100 nm inclusive, for instance around 50 nm.

In at least one embodiment of a component, which is produced in particular according to a method described here and/or is detached from the common carrier of the composite component described here, this is a surface-emitting laser diode. In particular, the component is free of a growth substrate. The component may show residues or separation traces from the anchoring elements.

In accordance with at least one method for producing one or several electronic devices, a composite component described here is provided. In a subsequent method step, the sacrificial layer is removed. One of the components or a plurality of components can be removed with the aid of one or a plurality of stamps, wherein the anchoring elements release the components under mechanical load of the stamp or stamps so that the components are detached from the intermediate carrier.

The component or the plurality of components can be printed on a target surface, such as a printed circuit board of the to be produced electronic device or on a plurality of printed circuit boards of the to be produced electronic devices. The stamp or plurality of stamps can then be separated from the component or components. The components can thus be transferred individually or in groups from the composite component onto one or more target surfaces, such as printed circuit boards.

It is conceivable that other components of the to be produced electronic device are mounted in the same way on the same target surface, for example on the printed circuit board or printed circuit boards. The electronic devices can be touch pads, laser printers, recognition cameras, face recognition cameras, displays or systems of LEDs, sensors, laser diodes and/or detectors. The other, in particular transferable or printable elements of the electronic device may be LEDs, sensors, laser diodes and/or detectors.

In particular, the method described here is especially suitable for the production of a plurality of recognition cameras, in particular of face recognition cameras, wherein the components are in particular surface-emitting laser diodes (VCSEL). The recognition cameras can be used in the automotive industry, for example for the purpose of autonomous driving or parking. Such surface-emitting laser diodes can be switched on and off very quickly. Especially with an array of surface-emitting laser diodes, spatial information can be obtained precisely by means of a diffraction pattern.

The method described here is particularly suitable for the production of a component or composite component or electronic device described here. The features described in connection with the component, composite component or electronic device can therefore also be used for the method, and vice versa.

Further preferred embodiments and further developments of the component, the composite component and of the method will become apparent from the exemplary embodiments explained below in conjunction with FIGS. 1A to 5B.

Figure 1B:
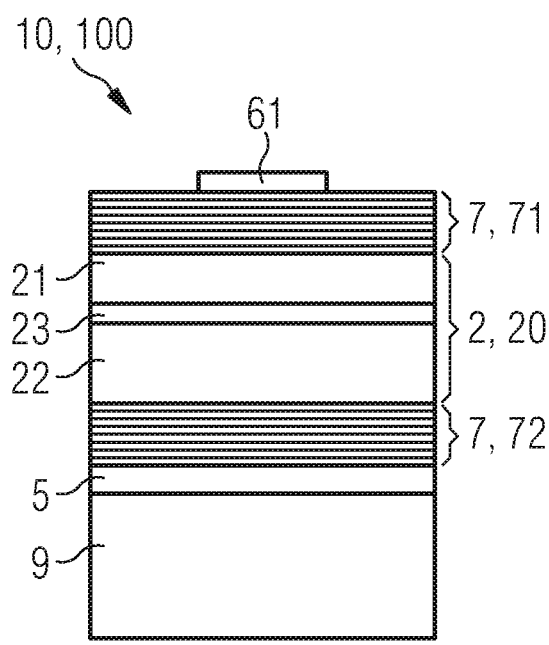
Figure 1C:
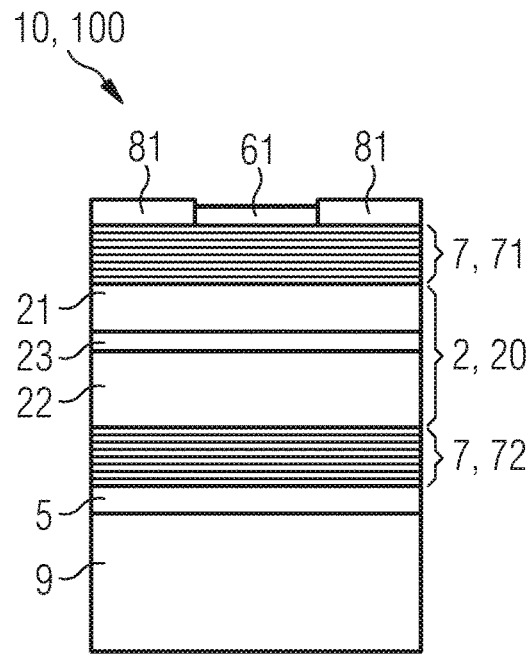
Figure 1D:
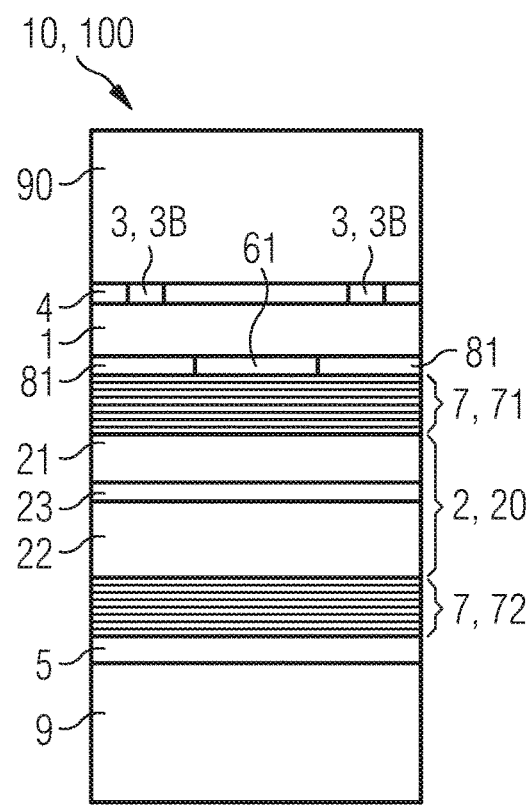
Figure 1G:
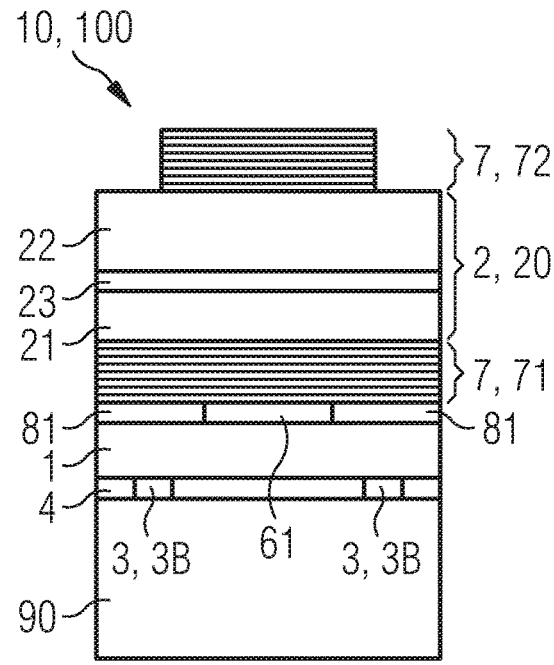
Figure 1H:
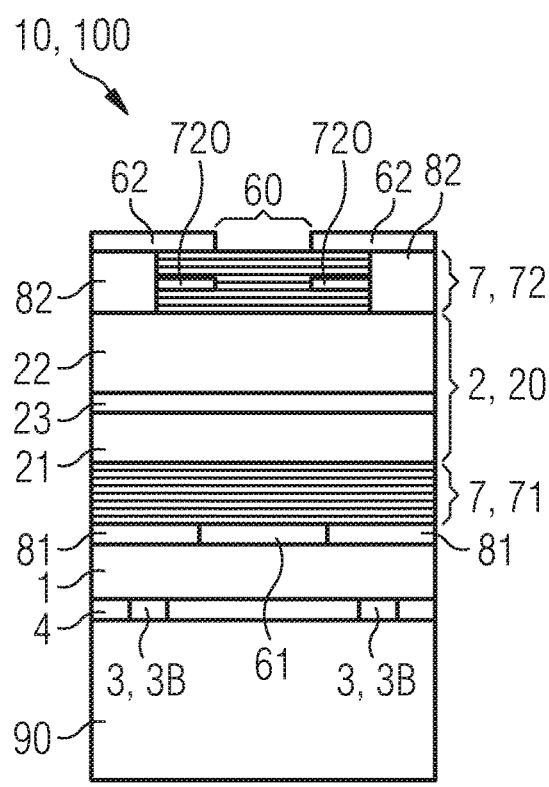
Figure 1I:
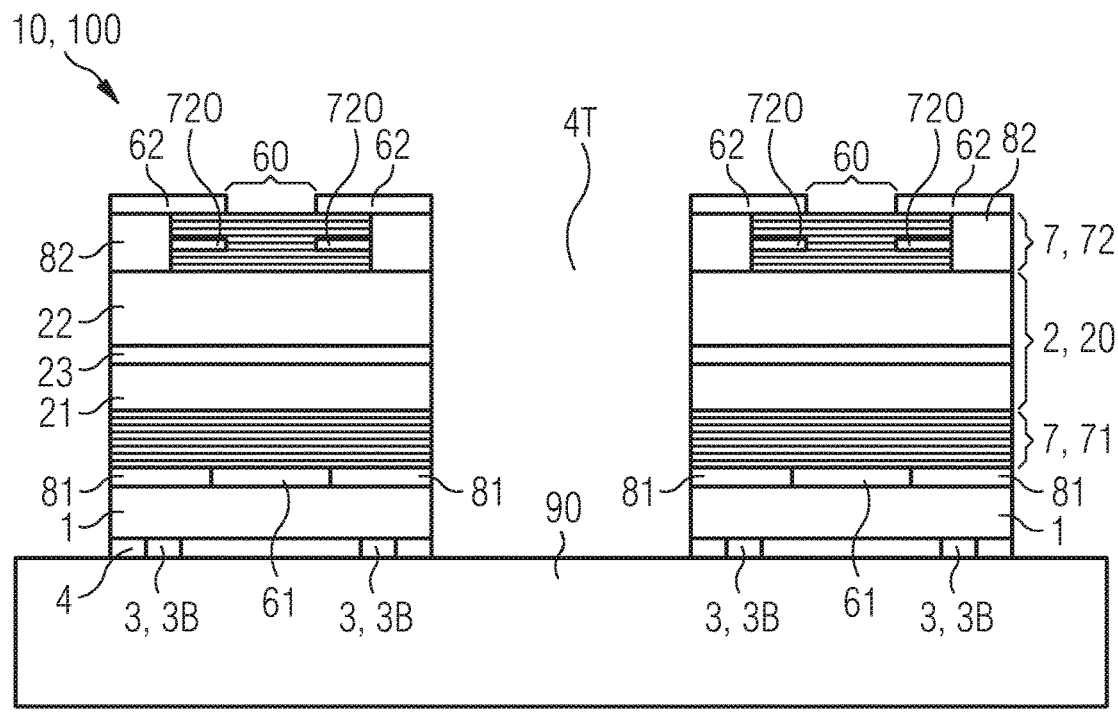
Figure 2A:
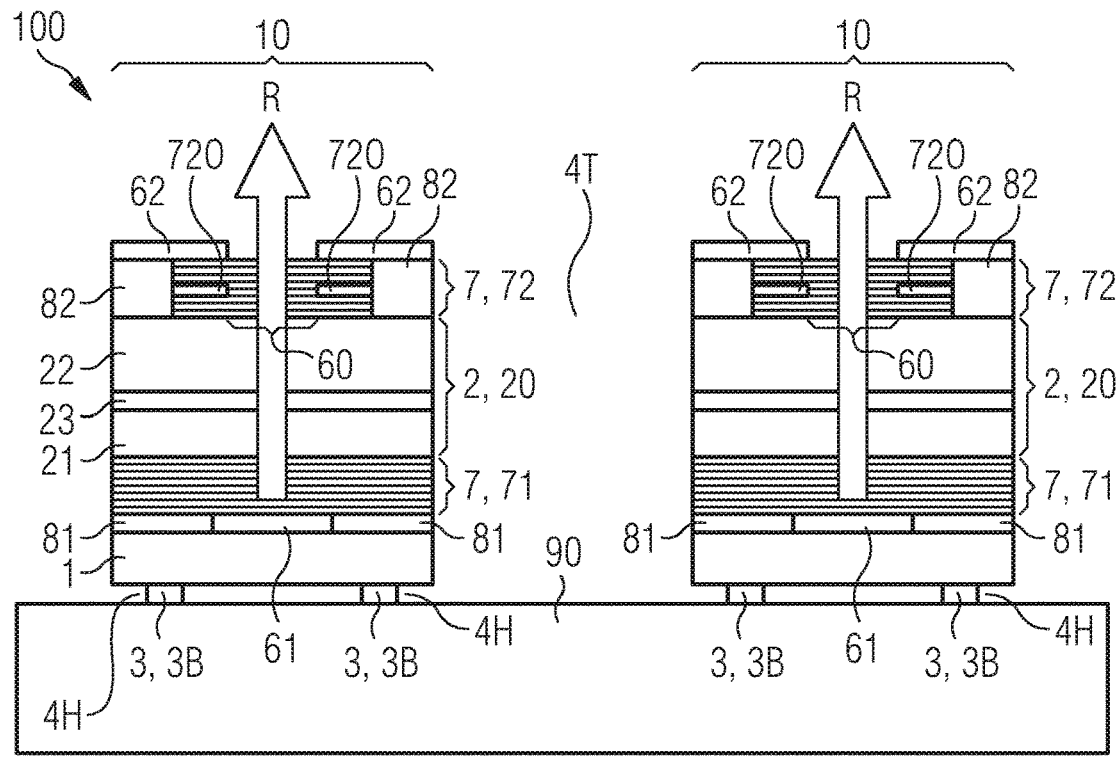
Figure 2B:
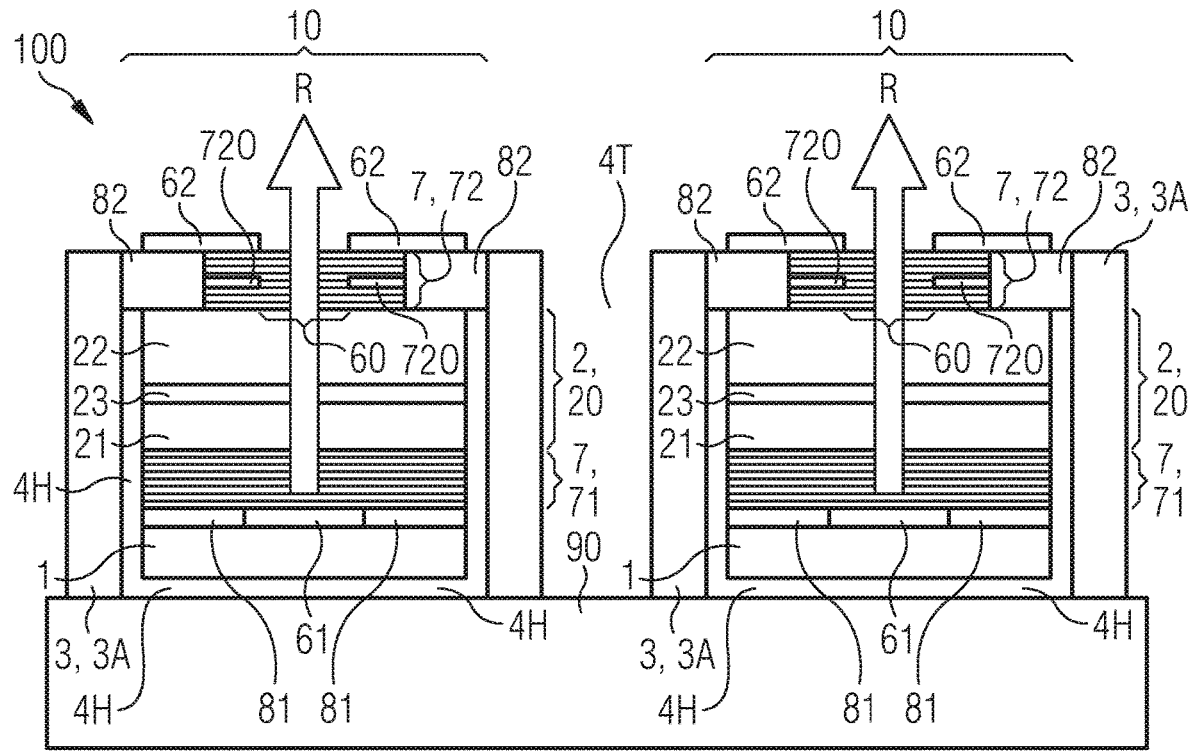
Figure 2C:
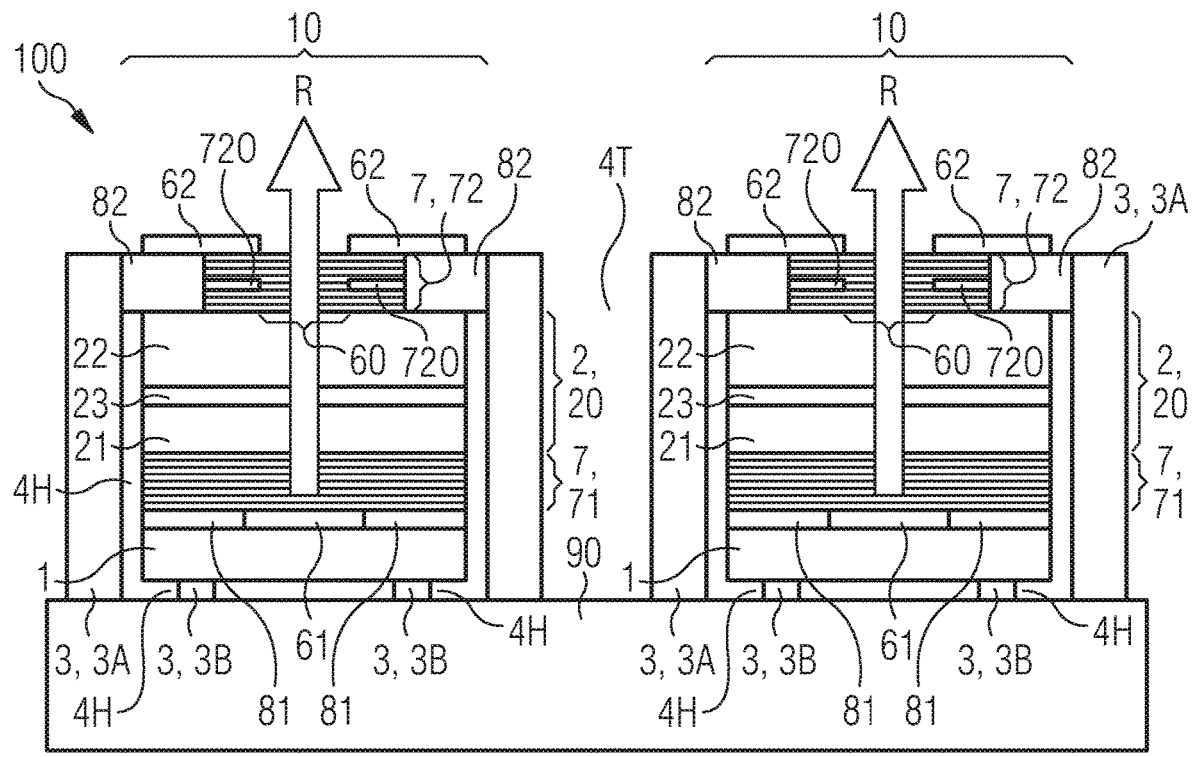
Figure 3A:
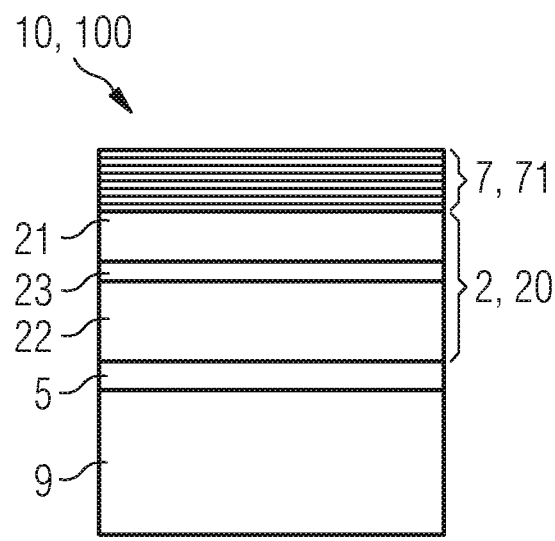
Figure 3B:
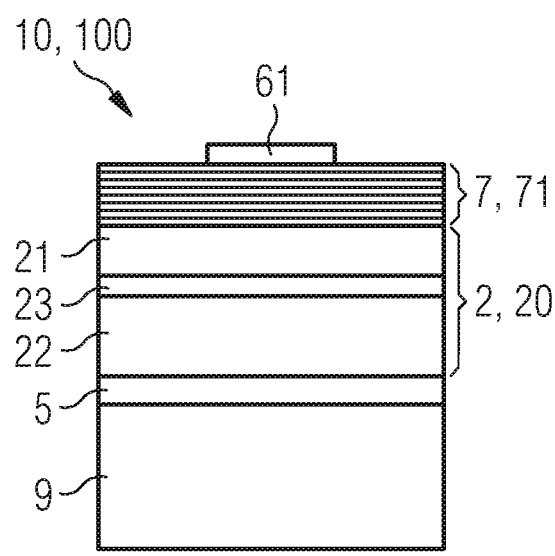
Figure 3C:
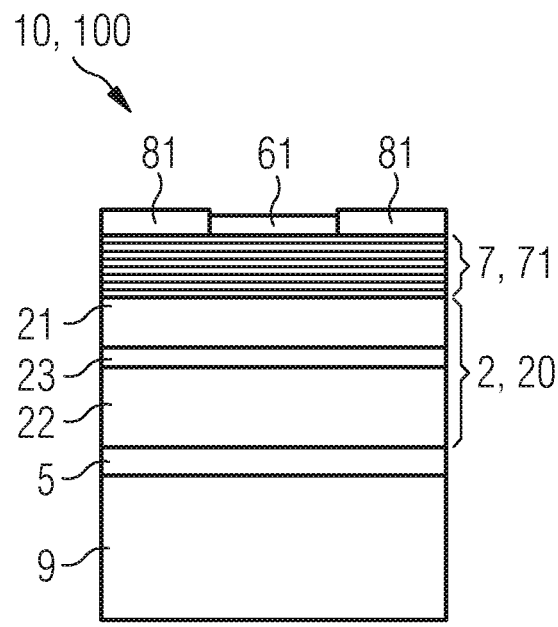
Figure 3D:
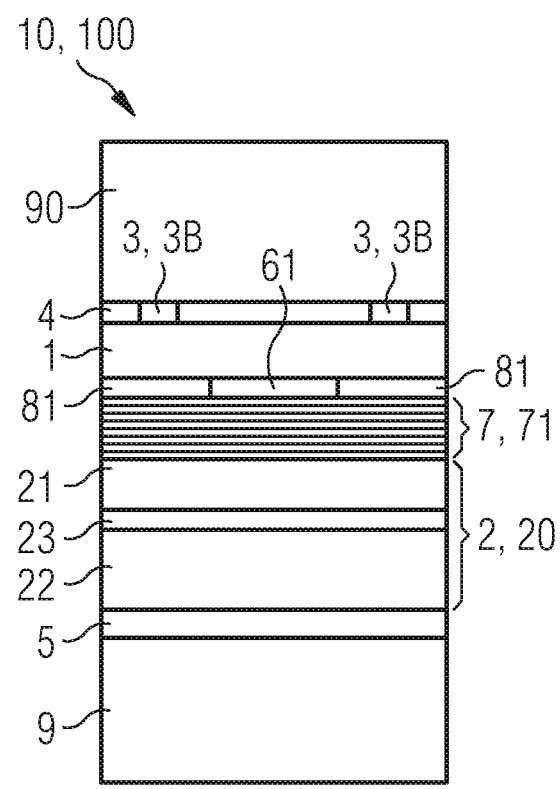
Figure 3E:
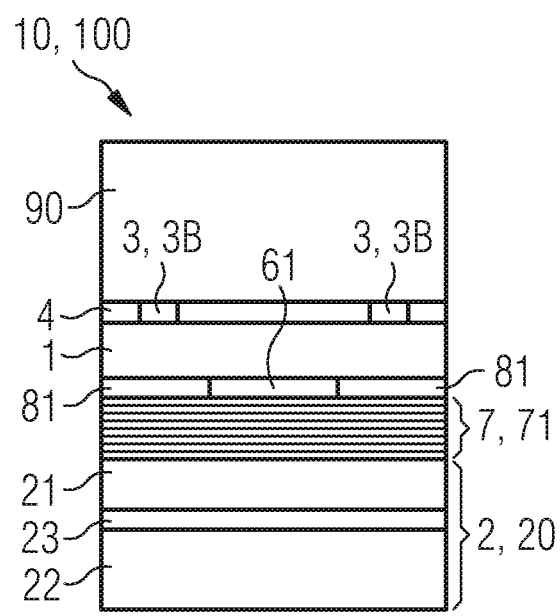
Figure 3F:
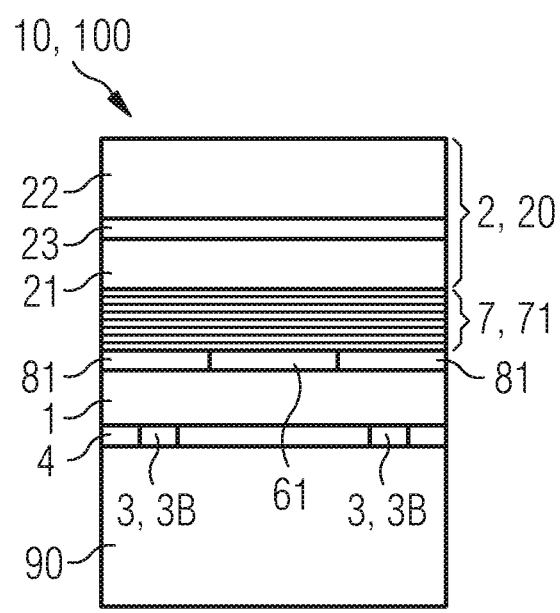
Figure 3G:
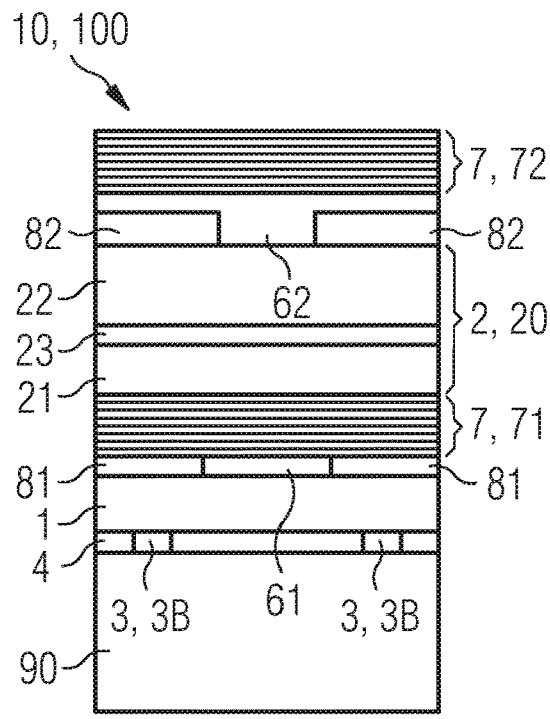
Figure 3H:
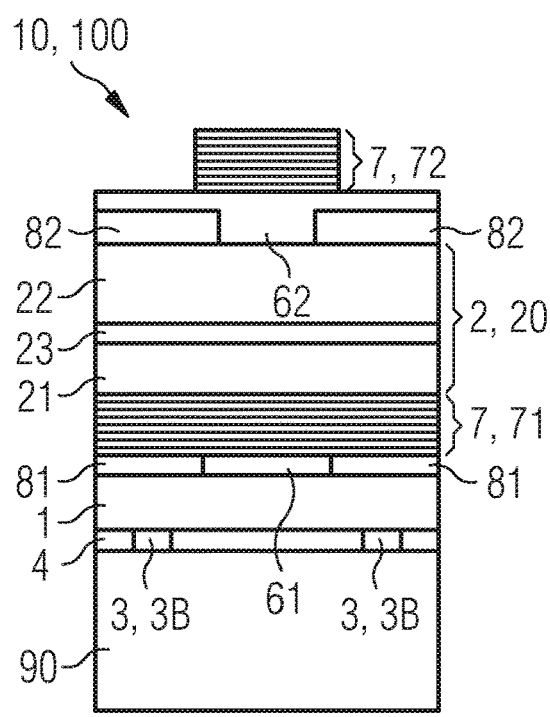
Figure 3I:
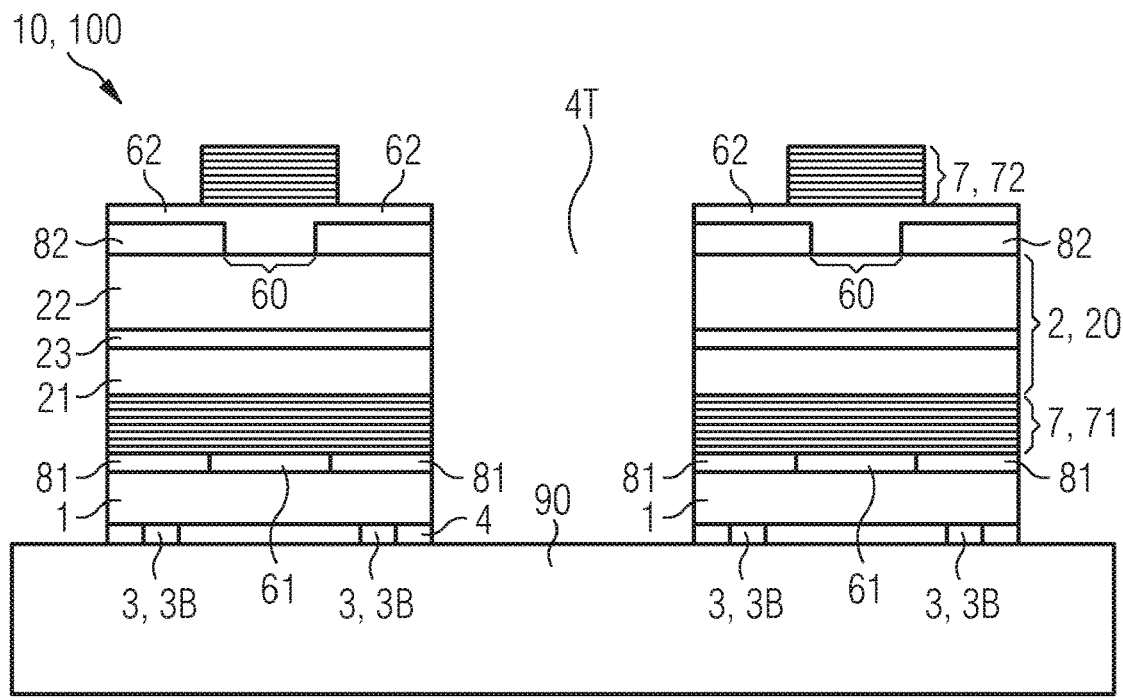
Figure 4A:
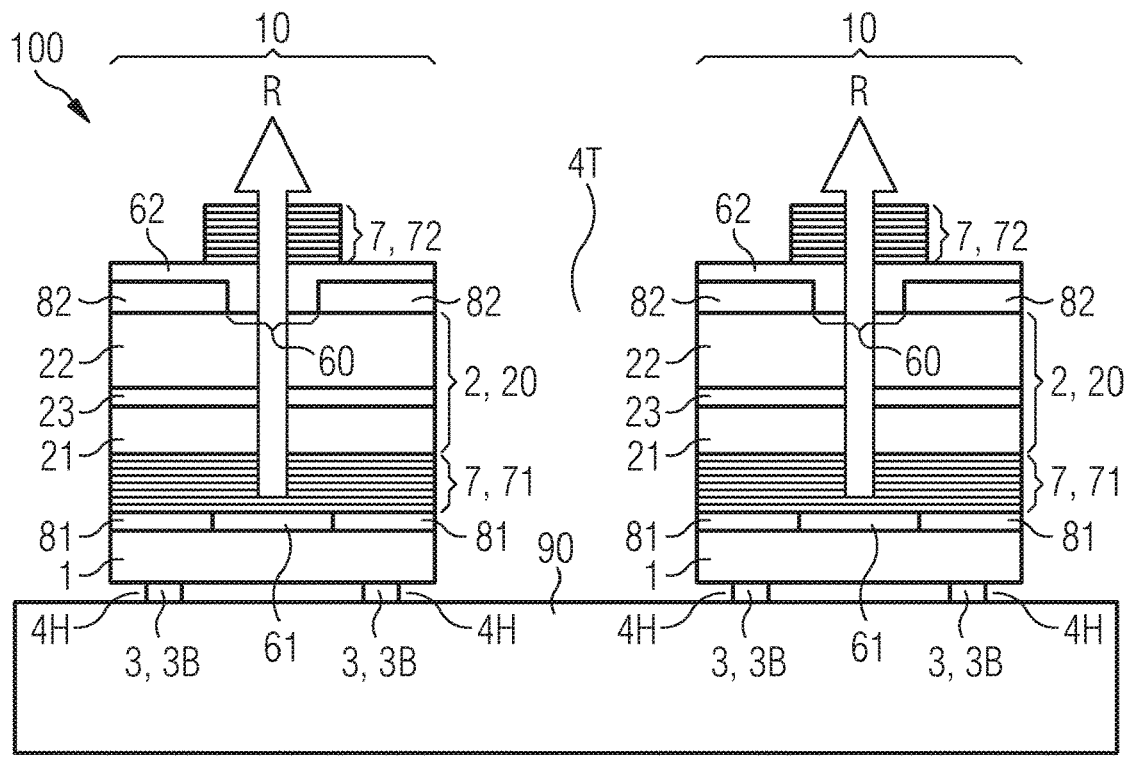
Figure 4B:
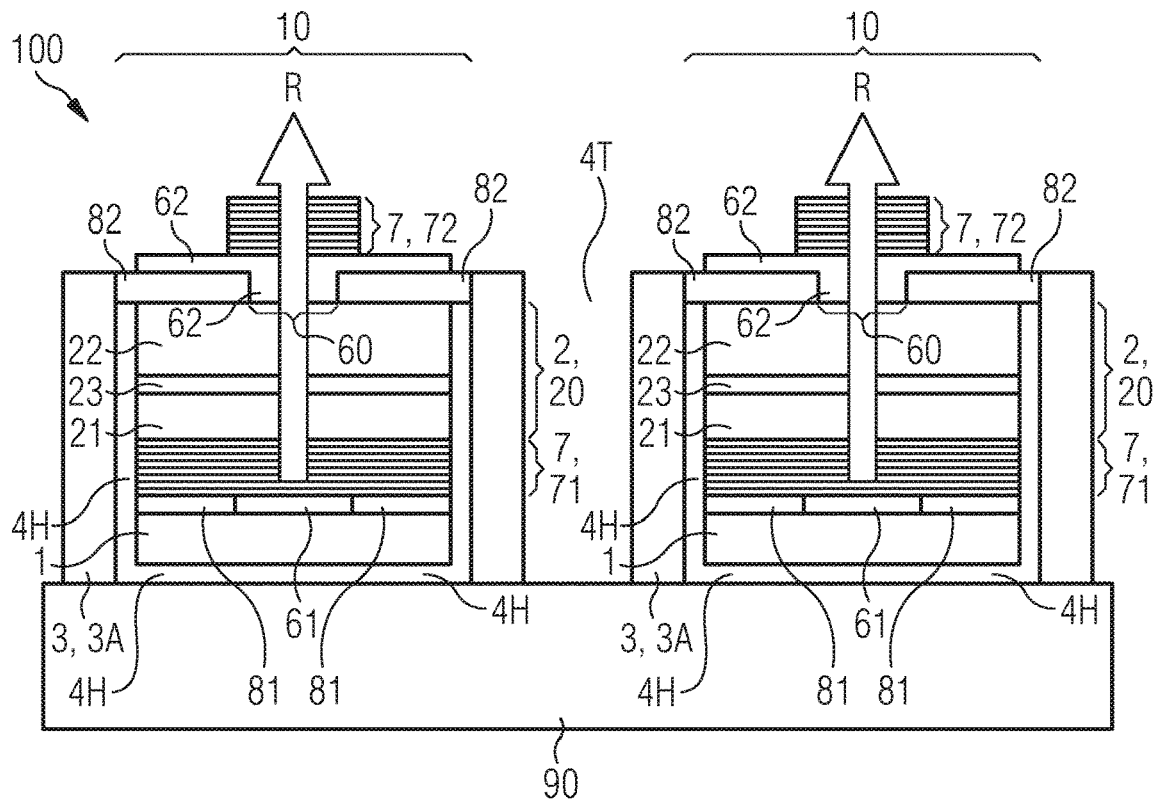
Figure 4C:
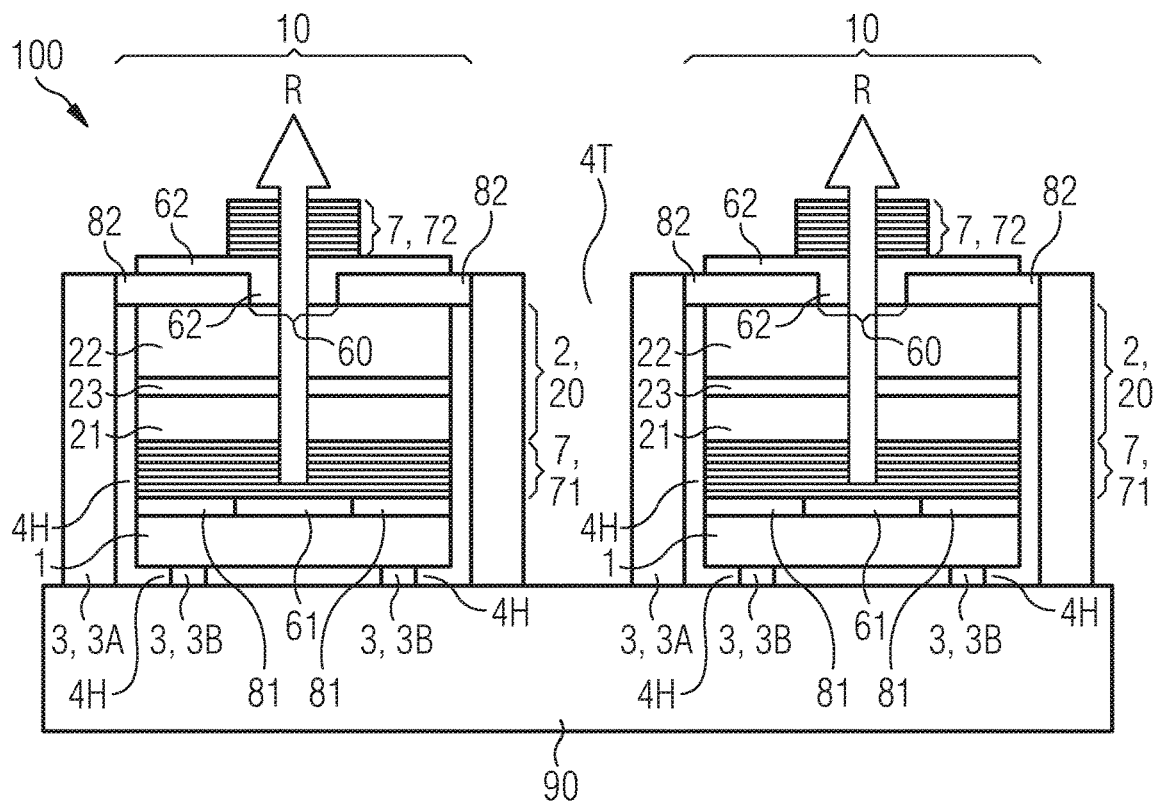
Figure 5A:
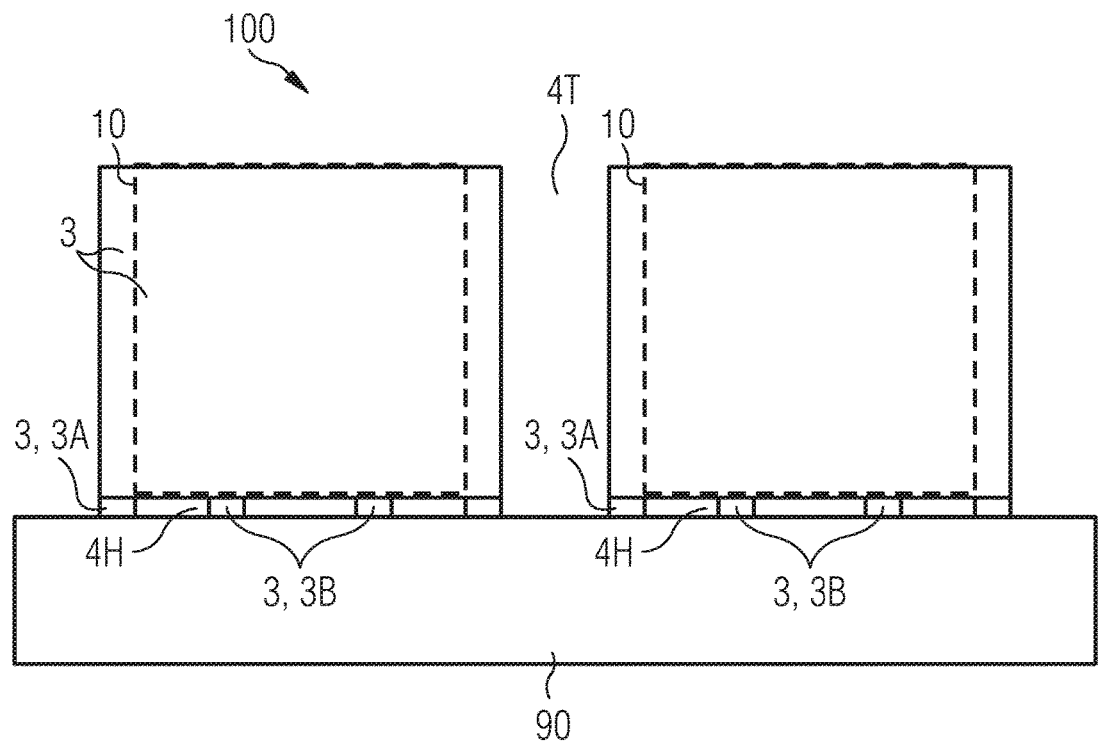
Figure 5B:
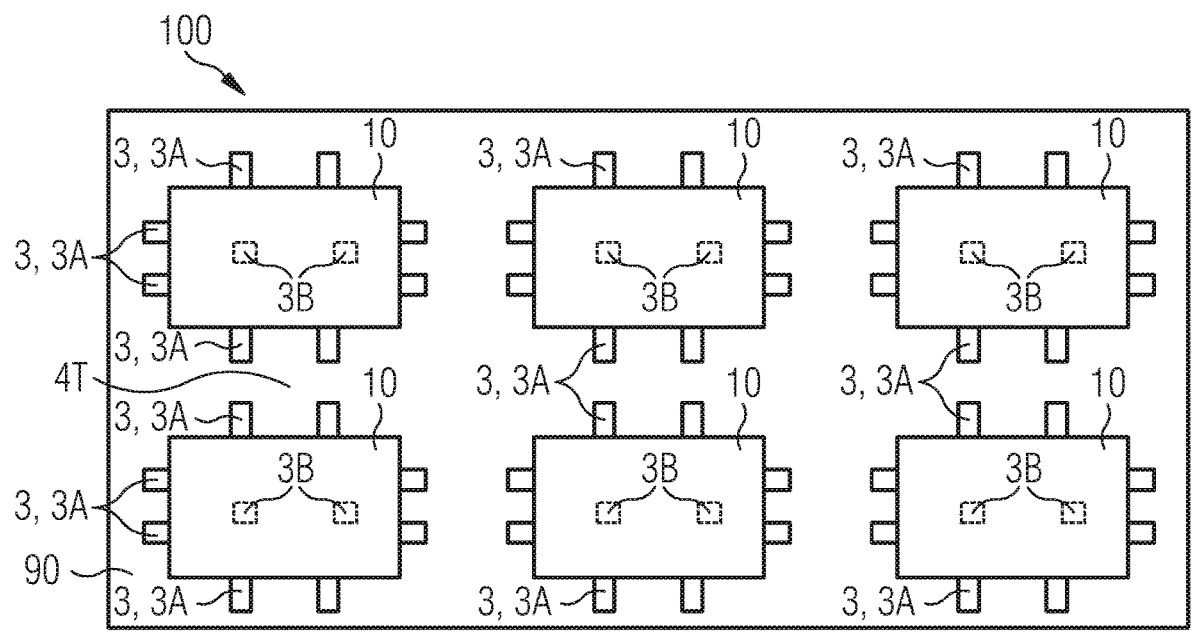

FIGS. 1A, 1B, 1C, 1D, 1E, 1F, 1G, 1H and 1I show schematic illustrations of process sequences for the production of a composite component, FIGS. 2A, 2B and 2C show schematic illustrations of various exemplary embodiments of a composite component, FIGS. 3A, 3B, 3C, 3D, 3E, 3F, 3G, 3H and 3I show schematic illustrations of various method steps in a process sequence for producing a composite component, FIGS. 4A, 4B and 4C show schematic illustrations of further exemplary embodiments of a composite component, and FIGS. 5A and 5B schematic illustrations of further exemplary embodiments of a composite component in side view and top view.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

FIG. 1A schematically illustrates a method step for the production of a composite component 100 or for the production of a plurality of components 10.

According to FIG. 1A, a semiconductor structure 20 is provided on a substrate 9, in particular on a growth substrate 9. In particular, the substrate 9 is a semiconductor substrate based, for example, on gallium arsenide. The semiconductor structure 20 comprises a first semiconductor layer 21, a second semiconductor layer 22 and an active zone 23 located between the semiconductor layers 21 and 22. The active zone 23 is especially configured for emitting electromagnetic radiation. The semiconductor structure 20 can be based on a III-V or II-VI semiconductor compound material. For example, semiconductor structure 20 is based on gallium nitride. The first semiconductor layer 21 is arranged in particular on the p-side. For example, the first semiconductor layer 21 is p-type or p-doped. The second semiconductor layer 22 is especially arranged on an n-side and can be n-conductive or n-doped. The active zone 23 is in particular a pn-junction zone.

The semiconductor structure 20 is based on a group III-V compound semiconductor material if it comprises in particular at least one element from main group III, such as Al, Ga, In, and one element from main group V, such as N, P, As. In particular, the term "III-V compound semiconductor material" includes the group of binary, tertiary and quaternary compounds containing at least one element from the main group III and at least one element from the main group V, such as nitride and phosphide compound semiconductors. Similarly, this applies analogously for a semiconductor structure 20 based on the group II-VI compound semiconductor material.

According to FIG. 1A, the semiconductor structure 20 is arranged in the vertical direction between two mirror arrangements of a resonator 7, in particular of a laser resonator 7. For example, the laser resonator 7 comprises a first mirror arrangement 71, which is in particular a first Bragg mirror, and a second mirror arrangement 72, which may be a second Bragg mirror. For example, the number of layers of the first Bragg mirror 71 and/or of the second Bragg mirror 72 is between 6 and 100 inclusive, for instance between 10 and 50 or between 10 and 30 inclusive. For example, the first Bragg mirror 71 and/or the second Bragg mirror 72 is/are based on a III-V or II-VI compound semiconductor material.

The Bragg mirrors 71 and 72 may each comprise a plurality of comparatively thin semiconductor layers, wherein the semiconductor layers are alternately arranged on top of each other and wherein adjacent semiconductor layers of the first and/or second Bragg mirror have different refractive indices. The first Bragg mirror 71 and/or the second Bragg mirror 72 can/can be formed to be electrically conductive. It is possible that the semiconductor structure 20 and the Bragg mirrors 71 and 72 are based on the same compound semiconductor material. The semiconductor layers of the semiconductor structure 20 and the laser resonator 7 can be deposited on the growth substrate 9 by means of an epitaxial process.

In FIG. 1A, a buffer layer 5 is located between the growth substrate 9 and the second Bragg mirror 72 and between the growth substrate 9 and the semiconductor structure 20, respectively. At the buffer layer 5, the growth substrate 9 can be removed from the semiconductor structure 20 in a later method step. It is possible that the growth substrate 9 is not completely removed from the semiconductor structure 20, but only partially. In this case the growth substrate 9 is only thinned. However, the buffer layer 5 can be optional.

A first contact layer 61 is formed as shown in FIG. 1B. The first contact layer 61 is particularly adjacent to the first Bragg mirror 71. In particular, the first contact layer 61 is configured to electrically contact the first semiconductor layer 21. The first Bragg mirror 71 is arranged in the vertical direction between the first contact layer 61 and the first semiconductor layer 21.

In particular, only a section of the semiconductor structure 20 is schematically shown in FIG. 1B. In particular, this section of the semiconductor structure 20 corresponds to a semiconductor body 2 of the component 10. In a top view of the growth substrate 9, the first contact layer 61 only partially covers the first Bragg mirror 71, the semiconductor body 2 and/or the second Bragg mirror 72. In this way, it can be achieved that electrical charge carriers are injected into semiconductor body 2 possibly only in the region of the semiconductor body overlapping with the first contact layer 61.

Deviating from FIG. 1B, a plurality of laterally spaced first contact layers 61 can be formed on the first Bragg mirror 71 or on the semiconductor structure 20. The semiconductor structure 20 can be singulated into a plurality of semiconductor bodies 2, wherein each first contact layer 61 is assigned in particular exactly to one of the semiconductor bodies 2, and vice versa. The number of the first contact layers 61 can thus determine the number of the semiconductor bodies 2. The first contact layers 61 can be applied in a structured manner on the semiconductor structure 20. Alternatively, it is possible that a common contact layer is first applied over a large area on the semiconductor structure 20 and then structured into a plurality of the first contact layers 61 in a subsequent method step. The first contact layer 61 can be formed from a metal such as copper, aluminum, gold or silver.

As shown in FIG. 1C, the first contact layer 61 is passivated laterally. In particular, the first contact layer 61 is completely surrounded in lateral directions by a first insulating layer 81. Free regions of the first Bragg mirror 71 and/or of the semiconductor structure 20 or of the semiconductor body 2, which are not previously covered by the first contact layer 61 or by the contact layers 61 in top view, can be covered, in particular completely covered, by the first insulating layer 81. The passivation of the first structured contact layer 61 by the first insulating layer 81 leads in particular to the formation of an aperture for imprinting current in the component 10.

Deviating from FIGS. 1B and 1C, it is conceivable that the first contact layer 61 is formed over such a large area that, in top view, it essentially completely covers, or fully covers, the semiconductor body 2. In this case, the formation of the aperture of the component 10 can only be carried out on the side of the second Bragg mirror 72, i.e. on the n-side.

According to FIG. 1D, a mirror layer 1 is applied onto the first contact layer 61 and onto the first insulating layer 81. In top view, the mirror layer 1 can completely cover the semiconductor body 2. In particular, the first mirror layer 1 is electrically conductive. For example, the mirror layer 1 directly adjoins the first contact layer 61. Preferably, the mirror layer 1 is formed from a metal such as aluminum or silver. The vertical layer thickness of the mirror layer 1 can be adjusted in such a way that the mirror layer 1 is formed as the only carrier layer of the component 10 after the removal of the growth substrate 9. The mirror layer 1 made of a metal usually has a much lower thermal resistance than a substrate made of, for example, a semiconductor material. Having the mirror layer formed as a carrier layer, the mechanical stability of the component and at the same time the heat distribution in the component or the heat dissipation from the component can be improved.

As shown in FIG. 1D, the semiconductor structure 20 is mechanically attached to an intermediate carrier 90 via a sacrificial layer 4. For example, the sacrificial layer 4 directly adjoins the intermediate carrier 90 and/or the mirror layer 1. For example, the sacrificial layer 4 is formed from a removable material, for instance from an etchable material. With respect to the materials of the mirror layer 1 and the intermediate carrier 90 or the semiconductor structure 20, the material of the sacrificial layer 4 is preferably selectively removable.

As shown in FIG. 1D, the sacrificial layer 4 may have openings which are filled by a material of an anchoring structure 3. The anchoring structure 3 thus has in particular a plurality of anchoring columns 3B in the openings of the sacrificial layer 4. The anchoring columns 3B each provide a mechanical connection in particular between the intermediate carrier 90 and the mirror layer 1 or the semiconductor structure 20. With respect to the geometries and the materials, the anchoring elements 3B or the anchoring columns 3B are preferably formed in such a way that after removing the sacrificial layer 4, they breakable or detachable under mechanical load. The anchoring elements 3B or the anchoring columns 3B can be made of an electrically insulating material or of an electrically conductive material. In particular, the material of the anchoring elements 3B has a lower etching rate than a material of the sacrificial layer 4, for example an etching rate which is at least 5 times, 10 times, 20 times or 100 times lower.

According to FIG. 1E, the growth substrate 9 is removed from the semiconductor structure 20, especially at the buffer layer 5. The buffer layer 5 can be partially or completely removed from the semiconductor structure 20.

The exemplary embodiment shown in FIG. 1F corresponds to the exemplary embodiment shown in FIG. 1E for a method step for producing a composite component 100 having a plurality of components 10 on a common intermediate carrier 90. Compared to FIG. 1E, the composite component 100 shown in FIG. 1F is only turned over along the vertical direction.

The second Bragg mirror 72 is structured as shown in FIG. 1G. In the region of the respective semiconductor body 2, the structured Bragg mirror 72 only partially covers the underlying semiconductor body 2. In a plan view of the semiconductor body 2, the structured Bragg mirror 72 can completely cover the first contact layer 61. In particular, the structured Bragg mirror 72 partially covers the first insulating layer 81. For structuring the second Bragg mirror 72, an etching process can be used.

According to FIG. 1H, the structured second Bragg mirror 72 is passivated laterally. In the lateral directions, the second Bragg mirror 72 is completely surrounded by a second insulating layer 82. Surfaces of the semiconductor body 2 which are exposed by the structuring of the second Bragg mirror can be covered, in particular completely covered, by the second insulating layer 82.

As shown in FIG. 1H, the second Bragg mirror 82 may have internal insulating regions 72O for forming an aperture 60 of the component 10. The inner insulating regions 72O can be oxidized regions of the Bragg mirror 72. The oxidized regions of the Bragg mirror 72 may include alumina. In particular, the inner insulating regions 72O of the second Bragg mirror 72 are formed, for example, by an oxidation process, but not prior to the structuring of the second Bragg mirror. The aperture 60 is predetermined particularly by a window of the insulating regions 72O. The aperture 60 of the component 10 is thus defined in particular by the shape of the inner insulating regions 72O of the second Bragg mirror 72 and/or by the position of the structured first contact layer 61. In a plan view of the semiconductor body 2, the window of the insulating regions 72O overlaps in particular completely with the first contact layer 61.

According to FIG. 1H, a second contact layer 62 is formed in places on the second insulating layer 82 and in places on the second Bragg mirror 72. The second contact layer 62 is in electrical contact, in particular direct electrical contact, with the second Bragg mirror 72. In region of the aperture 60 of the component 10, the second contact layer 62 has an opening. In particular, the second contact layer 62 is formed from a metal. The second contact layer 62 can be formed from a material that is not radiation-transmissive. The opening of the second contact layer 62 in region of the aperture 60 ensures that the electromagnetic radiation generated during operation of the component 10 is decoupled from the component 10 in region of the aperture 60. Deviating from FIG. 1H, it is possible that the second contact layer 62 is formed from a radiation-transmissive, electrically conductive material, in particular from a transparent electrically conductive oxide. Such second contact layer 62 may completely cover the second Bragg mirror 72 and/or the second insulating layer 82.

According to FIG. 1I, the semiconductor structure 20 is singulated into a plurality of semiconductor bodies 2. For this purpose, several separation trenches 4T can be formed throughout the second insulating layer 82, the semiconductor structure 20, the first Bragg mirror 71, the first insulating layer 81, the sacrificial layer 4 and/or the mirror layer 1. The semiconductor bodies 2 and thus the components 10 are thus separated from each other in the lateral directions by the separation trenches 4T.

Even after singulation, the components 10 can still be mechanically attached to the same intermediate carrier 90. A composite component 100 having a number of transferable components 10 on a common intermediate carrier 90 is shown schematically in FIG. 1I. Via the sacrificial layer 4 and the anchoring structure 3 having the anchoring elements 3B, the components 10 are still placed in an orderly manner on the common intermediate carrier 90, wherein the components 10 can be detached from the intermediate carrier 90 individually or in groups, for example by removing the sacrificial layer 4 and in particular by breaking or detaching the anchoring elements 3B. Deviating from FIG. 1I, it is possible that the separation trenches 4T are formed only up to the sacrificial layer 4. In this case, the sacrificial layers 4 assigned to the components 10, in particular to all components 10, can still form a common contiguous sacrificial layer 4 of the composite component 100.

The exemplary embodiment for a composite component 100 shown in FIG. 2A essentially corresponds to the exemplary embodiment for a composite component 100 shown in FIG. 1I. In contrast, the sacrificial layer 4 is removed, in particular etched away. Instead of the sacrificial layer 4, there is a cavity 4H between the component 10 and the intermediate carrier 90. In particular, after the removal of the sacrificial layer 4, the component 10 is mechanically connected to the intermediate carrier 90 exclusively by the anchoring elements 3B, in this case by the anchoring columns 3B.

Preferably, the anchoring elements 3B are made of an electrically conductive material. It is possible that the intermediate carrier 90 has conductor tracks which are in electrical contact with the anchoring elements 3B. In this case, the components 10 can already be tested for their functionality on the common intermediate carrier 90 when the components 10 are electrically contacted via the electrically conductive anchoring elements 3B and the second contact layers 62.

As schematically shown in FIG. 2A, electrical charge carriers are injected into the semiconductor body 2 preferably in the overlapping areas of the first contact layer 61 and of the window of the insulating regions 72O, so that electromagnetic radiation R is generated in particular exclusively in the areas of the active zone 23 below the aperture 60 and is coupled out of the component 10 through the aperture 60.

The exemplary embodiment shown in FIG. 2B essentially corresponds to the exemplary embodiment of a composite component 100 shown in FIG. 2A. In contrast, the anchoring structure 3 has a plurality of anchoring elements 3A which are arranged laterally to the components 10. In this case, the laterally arranged anchoring elements 3A are formed as lateral tethers 3A of the component 10. Along the vertical direction, such a tether 3A can extend from the second insulating layer 82 to the intermediate carrier 90. However, it is also possible that the tethers 3A are only formed in the immediate vicinity of the intermediate carrier 90 and do not extend as far as the second insulating layer 82. A component 10 can have a plurality of tethers 3A, for example at least two, three, four or at least six such tethers 3A.

After removal of the sacrificial layer 4, a cavity 4H may be formed between the component 10 and the intermediate carrier 90. With respect to their geometries and materials, the tethers 3A may be formed such that they break mechanically when the associated component 10 is pressed and/or tear when the component 10 is lifted. In other words, the anchoring elements 3A, in particular the tethers 3A, may be formed in such a way that under mechanical load, the anchoring elements 3A release the components 10 so that the components 10 can be detached individually or in groups from the intermediate carrier 90 and are thus formed to be transferable or printable.

As shown in FIG. 2B, the cavity 4H can also be located in the lateral direction between the component 10 and the anchoring elements 3A. In other words, the semiconductor body 2, the Bragg mirror 71 or the mirror layer 1 may be spaced apart from the tether 3A or from the tethers 3A. Deviating from FIG. 2B, it is possible that anchoring structure 3 having the anchoring elements 3A is adjacent, in particular directly adjacent to the lateral surfaces of the component 10 or of the semiconductor body 2. In this case, the anchoring structure 3 may have predetermined breaking points formed in particular by the anchoring elements 3A which are located for instance at the height of the cavity 4H between the mirror layer 1 and the intermediate carrier 90 (FIG. 5A).

The exemplary embodiment of a composite component 100 shown in FIG. 2C essentially corresponds to the exemplary embodiments of a composite component 100 shown in FIGS. 2A and 2B. In contrast, the composite component 100 has both lateral tethers 3A and anchoring columns 3B. The tethers 3A can be formed on the sides of the component 10 in the regions of the separation trenches 4T. The formation of the lateral tethers 3A thus takes place in particular after the separation of the semiconductor structure 20 into a plurality of semiconductor bodies 2. The formation of the anchoring columns 3B can be carried out before the singulation of the semiconductor structure 20.

The method steps shown in FIGS. 3A, 3B, 3C, 3D, 3E, 3F, 3G, 3H and 3I for producing a composite component 100 essentially correspond to the method steps shown in FIGS. 1A to 1I for producing a composite component 100. In contrast to this, the second Bragg mirror 72 can be formed to be electrically insulating.

The exemplary embodiment shown in FIG. 3A essentially corresponds to the exemplary embodiment shown in FIG. 1A, but without the second Bragg mirror 72.

Very similar to FIG. 1B, one or a plurality of first contact layers 61 are formed according to FIG. 3B. Similar to the exemplary embodiment shown in FIG. 1C, the first contact layer 61 is laterally passivated by the first insulating layer 81 according to FIG. 3C.

The method steps shown in FIGS. 3D, 3E and 3F essentially correspond to the method steps shown in FIGS. 1D, 1E and 1F, respectively, wherein a mirror layer 1 and a sacrificial layer 4 having the anchoring structure 3 are formed between the first Bragg mirror 71 and the intermediate carrier 90 before the growth substrate 9 is partially or completely removed from the semiconductor structure 20.

According to FIG. 3G, the second insulating layer 82 is formed on the semiconductor structure 20. The second insulating layer 82 may have one or a plurality of openings. In the opening or the openings of the second insulating layer 82, the semiconductor structure 2, in particular the second semiconductor layer 22, may be exposed in places. A second contact layer 62 is formed for electrically contacting the second semiconductor layer 22 or the semiconductor structure 20, wherein the second contact layer 62 extends into the opening or openings of the second insulating layer 82. Outside the opening or openings of the second insulating layer 82, the second contact layer 62 can cover, in particular completely cover the second insulating layer 82.

In the regions of the opening or openings of the second insulating layer 82, the second contact layer 62 may be in direct electrical contact with the semiconductor structure 20 or with the second semiconductor layer 22. The opening of the second insulating layer 82 can thus define the aperture 60 of the component 10 (FIG. 3I). The second contact layer 62 is preferably made of a material that is radiation-transmissive and electrically conductive. For example, the second contact layer is formed from a transparent and electrically conductive oxide (TCO).

The second Bragg mirror 72 can be applied onto the second contact layer 62. In the vertical direction, the second contact layer 62 is located for instance between the second Bragg mirror 72 and the semiconductor body 2. The second Bragg mirror 72 can initially be formed flat and can be structured in a subsequent method step in such a way that the second Bragg mirror 72 has a plurality of laterally spaced sublayers which, in top view, each covers, in particular completely covers, an opening of the second insulating layer 82. Such a structured second Bragg mirror 72 is shown for instance in FIG. 3H. The second Bragg mirror 72 may be made of dielectric materials. For example, the second Bragg mirror 72 has a plurality of alternately arranged silicon nitride and/or silicon oxide layers.

A plurality of separation trenches 4T is formed according to FIG. 3I, similar to the exemplary embodiment of a method step for the singulation of the semiconductor structure 20 shown in FIG. 1I. The separation trenches 4T separate the semiconductor structure 20 into a plurality of semiconductor bodies 2.

The exemplary embodiments of a composite component 100 shown in FIGS. 3I, 4A, 4B and 4C essentially correspond to the exemplary embodiments of a composite component 100 shown in FIGS. 1I, 2A, 2B and 2C. The composite components 100 in FIGS. 3I, 4A, 4B and 4C differ from the composite components 100 shown in FIGS. 1I, 2A, 2B and 2C in particular in the designs of the second contact layer 62, the second insulating layer 82 and the second Bragg mirror 72. Other features described in connection with the component 10 or composite component 100 in FIGS. 1I, 2A, 2B and 2C can also be used for the exemplary embodiments described in FIGS. 3I, 4A, 4B and 4C.

FIG. 5A shows a composite component 100 in side view. The anchoring structure 3 having the tethers 3A can cover, in particular completely cover a side face or all side faces of the associated component 10. The tethers 3A are especially structured regions of the anchoring structure 3. The tethers 3A are located for instance at the vertical level of the sacrificial layer 4 or of the cavity 4H.

FIG. 5B shows a composite component 100 having a number of components 10 in a plan view of the common intermediate carrier 90. Each component 10 has a plurality of tethers 3A. In lateral directions, the tethers 3A extend laterally beyond the side faces of each component 10. The anchoring structure 3 can have a plurality of anchoring columns 3B, wherein the anchoring columns 3B are completely covered by the components 10 in top view.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

LIST OF REFERENCE MATERIALS

100 Composite component
10 Component
1 Mirror layer
2 Semiconductor body
20 Semiconductor structure
21 First semiconductor layer
22 Second semiconductor layer
23 Active zone
3 Anchoring structure
3A Anchoring element, tether
3B Anchoring element, anchoring column
4 Sacrificial layer
4H Cavity
4T Separation trench
5 Buffer layer
60 Aperture 61 First contact layer
62 Second contact layer
7 Laser resonator
71 First Bragg mirror
72 Second Bragg mirror
72O Insulating regions of the Bragg mirror
81 First insulating layer
82 Second insulating layer
9 Growth substrate
90 Intermediate carrier
R Radiation

The invention claimed is:

1. A method of producing a plurality of transferable components on a common intermediate carrier, wherein the components are configured to generate coherent electromagnetic radiation and each comprise a semiconductor body having an active zone, comprising the following steps:
   providing a semiconductor structure on the intermediate carrier, wherein the semiconductor structure is separable into a plurality of semiconductor bodies of the components and wherein a sacrificial layer is arranged in vertical direction between the semiconductor structure and the intermediate carrier;
   forming an anchoring structure having a plurality of anchoring elements; and
   removing the sacrificial layer, as a result of which the components are mechanically connected to the intermediate carrier solely via the anchoring structure, wherein the anchoring elements release the components under mechanical load so that the components are formed to be detachable from the intermediate carrier and thus transferable, wherein
      the components each have a laser resonator with a Bragg mirror pair comprising a first Bragg mirror and a second Bragg mirror, the semiconductor body of the respective component being arranged in the vertical direction between the first Bragg mirror and the second Bragg mirror,
      the first Bragg mirror is electrically conductive,
      the components each have an electrically conductive mirror layer on the rear side,
      the mirror layer is electrically connected to the first Bragg mirror via a first contact layer,
      the first contact layer is directly adjacent to the first Bragg mirror and only partially covers it for achieving a targeted local current injection,
      the first contact layer is completely surrounded in lateral directions by a first insulating layer, and
      the first insulating layer is arranged in a vertical direction between the first Bragg mirror and the mirror layer and has overlaps with both the first Bragg mirror and the mirror layer in top view.

2. The method according to claim 1,
   wherein the semiconductor structure is arranged on a growth substrate, the growth substrate being partially or completely removed from the semiconductor structure before the semiconductor structure is singulated into a plurality of semiconductor bodies of the components.

3. The method according to claim 2,
   wherein the growth substrate is completely removed from the semiconductor structure, and the components are formed as substrate-less surface-emitting laser diodes.

4. A composite component comprising a plurality of components, a removable sacrificial layer, an anchoring structure and a common intermediate carrier, wherein
   the components each comprise a semiconductor body having an active zone, are configured for generating coherent electromagnetic radiation and are arranged on the common intermediate carrier,
   the sacrificial layer is arranged vertically between the intermediate carrier and the components,
   the anchoring structure comprises a plurality of anchoring elements, wherein the anchoring structure and the sacrificial layer provide a mechanical connection between the intermediate carrier and the components, and
   without the sacrificial layer the components are mechanically connected to the intermediate carrier solely via the anchoring elements, wherein the anchoring elements are formed in such a way that under mechanical load they release the components so that the components are formed to be detachable from the intermediate carrier and thus transferable, wherein
      the components each have a laser resonator with a Bragg mirror pair comprising a first Bragg mirror and a second Bragg mirror, the semiconductor body of the respective component being arranged in the vertical direction between the first Bragg mirror and the second Bragg mirror,
      the first Bragg mirror is electrically conductive,
      the components each have an electrically conductive mirror layer on the rear side,
      the mirror layer is electrically connected to the first Bragg mirror via a first contact layer,
      the first contact layer is directly adjacent to the first Bragg mirror and only partially covers it for achieving a targeted local current injection,
   the first contact layer is completely surrounded in lateral directions by a first insulating layer, and
   the first insulating layer is arranged in a vertical direction between the first Bragg mirror and the mirror layer and has overlaps with both the first Bragg mirror and the mirror layer in top view.

5. The composite component according to claim 4,
   wherein the anchoring elements comprise tethers which are located sidewards of the components and are formed to be breakable or detachable under mechanical load when the components are removed.

6. The composite component according to claim 4,
   wherein the anchoring elements comprise anchoring columns which are located below the components, are arranged in the vertical direction exclusively between the intermediate carrier and the components and are formed to be breakable or detachable under mechanical load when the components are removed.

7. The composite component according to claim 6,
   wherein the anchoring columns are formed from an electrically conductive material and are electrically conductively connected to rear-side contact layers or mirror layers of the components.

8. The composite component according to claim 4,
   wherein the anchoring elements are formed from an electrically insulating material and are to be breakable when the associated component is pressed.

9. The composite component according to claim 4, wherein
   the sacrificial layer forms a common boundary layer between the intermediate carrier and the components, and
   without the sacrificial layer, a cavity is formed between the intermediate carrier and the components, wherein the anchoring elements are directly adjacent to the cavity in places or are arranged in the cavity.

10. The composite component according to claim 4, wherein both the first Bragg mirror and the second Bragg mirror of the Bragg mirror pair are electrically conductive.

11. The composite component according to claim 4, wherein the second Bragg mirror is electrically conductive and has inner insulating regions for forming an aperture of the component.

12. The composite component according to claim 4, wherein the second Bragg mirror is formed to be electrically insulating.

13. The composite component according to claim 4, wherein the first Bragg mirror and the second Bragg mirror of the same Bragg mirror pair have different cross-sections in top view.

14. The composite component according to claim 4, wherein the mirror layer is formed with respect to its vertical layer thickness such that it serves as a mechanically stabilizing layer and thus as a carrier for the associated component.

15. A component which is detached from the common carrier of the composite component according to claim 4, wherein the component is a surface-emitting laser diode which is free of a growth substrate.

16. A method for producing one or a plurality of electronic devices comprising the steps of:
providing the composite component according to claim 4;
removing the sacrificial layer;
removing one or a plurality of components using one or a plurality of stamps, wherein the anchoring elements release the components under mechanical load of the stamp or stamps so that the components are detached from the intermediate carrier;
printing the component or plurality of components on a printed circuit board of the to be produced electronic device or on a plurality of printed circuit boards of the to be produced electronic devices; and
separating the stamp or stamps from the component or components.

17. The method according to claim 16 for producing a plurality of recognition cameras, wherein the components are surface-emitting laser diodes.

* * * * *